US006844229B2

(12) United States Patent
Lee et al.

(10) Patent No.: US 6,844,229 B2
(45) Date of Patent: Jan. 18, 2005

(54) METHOD OF MANUFACTURING SEMICONDUCTOR DEVICE HAVING STORAGE ELECTRODE OF CAPACITOR

(75) Inventors: Moon-hee Lee, Yongin (KR); Woo-gwan Shim, Seoul (KR); Hyung-ho Ko, Seoul (KR); Jong-ho Chung, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 199 days.

(21) Appl. No.: 09/999,150

(22) Filed: Oct. 31, 2001

(65) Prior Publication Data

US 2002/0140018 A1 Oct. 3, 2002

(30) Foreign Application Priority Data

Mar. 28, 2001 (KR) ........................................ 2001-16326

(51) Int. Cl.⁷ ........................................... H01L 21/8242
(52) U.S. Cl. ........................ 438/239; 438/238; 438/253; 438/250; 438/244; 438/791; 438/787
(58) Field of Search ................................ 438/239, 238, 438/253, 250, 244, 791, 787

(56) References Cited

U.S. PATENT DOCUMENTS 6,180,452 B1 * 1/2001 Figura ........................ 438/255
6,372,575 B1 * 4/2002 Lee et al. .................... 438/253

OTHER PUBLICATIONS

George A. Kaplita, Stefan Schmitz, Rajiv Ranade, and Swami Mathad, "Polysilicon Planarization and Plug Recess Etching in a Decoupled Plasma Source Chamber Using Two Endpoint Techniques," MicroNews, vol. 6, No. 1, (2000) pp. 1–7.*

Gary E. McGuire, "Semiconductor Materials and Process Technology Handbook," Noyes Publ., Norwich, New York (1988) pp. 210–265.*
IBM Technical Disclosure Bulletin, "Chemical Control of Reactive Ion Etch Selectivities," vol. 32, No. 4A, (1989) pp. 354–355.*
IBM Technical Disclosure Bulletin, "Tapered Via Hole," vol. 26, No. 12, (1983) p. 6282.*
IBM Technical Disclosure Bulletin, "Process for Polysilicon Emitter Transistor" vol. 26, 10A,(1984) pp. 5134–5135.*
Korean Patent Abstract—Publication No. 2001–0059014; Publication Date Jul. 6, 2001.

* cited by examiner

Primary Examiner—Eddie Lee
Assistant Examiner—Thomas Magee
(74) Attorney, Agent, or Firm—F. Chau & Associates, LLC

(57) ABSTRACT

A method of manufacturing a semiconductor device having a storage electrode of a capacitor is provided. The method includes the steps of: forming a contact hole perforating through an interlayer dielectric layer on a semiconductor substrate; forming a conductive plug to fill the contact hole and expose the surface of the interlayer dielectric layer; forming molds on the interlayer dielectric layer to expose the surface of the conductive plug; recessing the upper surface of the conductive plug to expose a portion of the sidewalls of the interlayer dielectric layer; forming an electrode layer to cover the recessed conductive plug, and the sidewalls of the interlayer dielectric layer and the molds; and removing upper surfaces of the electrode layer to make a storage electrode until molds are exposed. The method further includes the steps of: forming a conductive pad electrically connected to the semiconductor substrate and a lower insulating layer surrounding the conductive pad; and forming bit line stacks on the lower insulating layer, wherein the interlayer dielectric layer covers the bit line stacks, and the contact hole between the bit line stacks exposes the conductive pad.

17 Claims, 3 Drawing Sheets

METHOD OF MANUFACTURING SEMICONDUCTOR DEVICE HAVING STORAGE ELECTRODE OF CAPACITOR

BACKGROUND OF THE INVENTION

1. Field of the Invention

The present invention relates to a method of manufacturing a semiconductor device, more particularly, to a method of manufacturing a storage electrode of a capacitor having an extended effective surface area.

2. Description of the Related Art

In a semiconductor memory device such as a dynamic random access memory (DRAM) having a plurality of memory cells, each cell must include as base components an access transistor and a storage capacitor. However, the recent high integration trend of semiconductor devices inevitably involves a reduction in size of each cell area, thereby resulting in a reduction in the area occupied by the capacitor.

Many attempts have been made to realize capacitors that can obtain a desired capacitance from a given small area.

The area of a capacitor and the dielectric constant of dielectric layers used to form the capacitor directly affect the capacitance value. The area of capacitor represents the effective area of dielectric layer between storage electrode and plate electrode, and an increase in the effective area of dielectric layer can increase capacitance. Meanwhile, dielectric layers such as $Ta_2O_5$ or $Al_2O_3$ are developed to replace conventional nitride-oxide (NO) dielectric layers, and layers having higher dielectric, such as $(Ba, Sr)TiO_3$ (BST), have also been proposed.

Metal electrodes are necessary for adopting high dielectric layers, but the use of these metal electrodes is accompanied by technical difficulties. Also, there are some technical limits to adopting capacitor using polysilicon electrode and $Ta_2O_5$ or $Al_2O_3$ dielectric layer as design rule of semiconductor devices decreases to 0.15 $\mu$m.

Accordingly, a need exists for a method of manufacturing a storage electrode of a capacitor having an extended effective surface area.

SUMMARY OF THE INVENTION

A method of manufacturing a semiconductor device having a capacitor is provided, which includes the steps of: forming a contact hole perforating through an interlayer dielectric layer on a semiconductor substrate; forming a conductive plug to fill the contact hole and expose the surface of the interlayer dielectric layer; forming molds on the interlayer dielectric layer to expose the surface of the conductive plug; recessing the upper surface of the conductive plug to expose a portion of the sidewalls of the interlayer dielectric layer; forming an electrode layer to cover the recessed conductive plug, and the sidewalls of the interlayer dielectric layer and the molds; and removing upper surfaces of the electrode layer to make a storage electrode until molds are exposed.

According to an aspect of the present invention, the method further includes the steps of: forming a conductive pad electrically connected to the semiconductor substrate and a lower insulating layer surrounding the conductive pad; and forming bit line stacks on the lower insulating layer, wherein the interlayer dielectric layer covers the bit line stacks, and the contact hole between the bit line stacks exposes the conductive pad.

According to a preferred embodiment of the present invention, each of the bit line stacks includes a bit line, a capping layer covering upper surfaces of the bit line, and spacers at least covering sidewalls of the bit line, and wherein the contact hole exposes the sidewalls of the capping layer and the spacers. And the step of recessing the upper surface of the conductive layer is performed until the spacers and the capping layer are exposed. The capping layer is formed of silicon nitride, the spacers are formed of silicon nitride, the interlayer dielectric layer is formed of silicon oxide, the molds are formed of silicon oxide, the conductive plug is formed of polysilicon. The step of recessing the upper surface of the conductive plug is performed by chemical dry etching, the chemical dry etching is performed by using an etching gas containing a fluorine-based gas.

According to an aspect of the present invention, the method further includes removing the molds after removing the upper surfaces of the electrode layer.

A semiconductor device having a storage electrode of a capacitor is also provided which includes; a semiconductor substrate having a conductive pad connected to an active region, wherein the conductive pad is disposed between first insulating layers; a plurality of bit line stacks disposed on the first insulating layers; second insulating layers disposed on the first insulating layers, wherein the second insulating layers cover a part of the plurality of bit line stacks; a conductive plug connected to the conductive pad, wherein the conductive plug is disposed between the second insulating layers, and between the plurality of bit line stacks, and the height of the conductive plug is substantially lower than the height of the second insulating layer; a storage electrode having a cylindrical shape is disposed on the conductive plug and the second insulating layers.

According to an aspect of the present invention, an upper part of the storage electrode is wider than a lower part of the storage electrode, and the bit line stack includes a bit line on the first insulating layer, a capping layer covering the upper surface of the bit line, and spacers at least covering sidewalls of the bit line.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
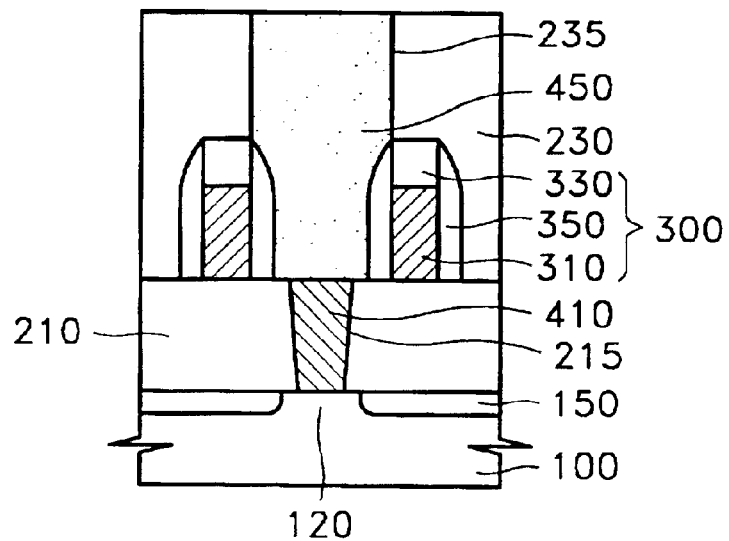
FIGS. 1 through 5 are cross-sectional views showing a method of manufacturing a semiconductor device having a storage electrode of a capacitor according to an embodiment of the present invention.

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer may be formed directly on the other layer or the substrate, or other layers may intervene therebetween.

FIG. 1 shows the steps of forming a plug 450 on a semiconductor substrate 100 by a self-aligned contact (SAC) method. Referring to FIG. 1, isolation regions 150 and a conductive pad 410 are formed on the semiconductor substrate 100 by a known method, and then a transistor (not shown) is formed. A lower insulating layer 210 on the semiconductor substrate 100 is etched by a general photolithography process to form a first contact hole 215 exposing the active region. And, a first conductive layer is formed to fill the first contact hole 215. Then, the first conductive layer is planarized by etch back or chemical mechanical polishing (CMP) to form a conductive pad 410. The conductive pad 410 is electrically connected to an active region 120 of the semiconductor substrate 100 which is defined by the isolation regions 150. According to a preferred embodiment, the lower insulating layer 210 is formed of silicon oxide to cover the transistor (not shown). And the process of forming the conductive pad 410 may be omitted or may be adopted as a method for overcoming a reduction in the design rule of semiconductor devices.

Next, a second conductive layer is formed on the lower insulating layer 210, and sequentially an insulating layer for capping layers 330 is formed on the second conductive layer. The insulating layer and the second conductive layer are sequentially patterned to form bit lines 310 whose upper surfaces are protected by capping layers 330. Then, spacers 350 are formed to protect the bit lines 310 on the sidewalls of the bit lines 310 and connect with the capping layers 330.

Bit line stacks 300 having the bit lines 310, the patterned capping insulating layers 330, and the spacers 350 are prepared for a self-aligned contact (SAC) process by which a buried contact (BC) hole is formed. The capping layers 330 and the spacers 350 prevent the bit lines 330 from being etched in the SAC process. Thus, the capping layers 330 and the spacers 350 are preferably formed of dielectric materials having an excellent etching selectivity ratio to silicon oxide, such as silicon nitride.

Since the SAC process is introduced for overcoming a reduction in the design rule of semiconductor devices, it can be omitted depending on the design rule of semiconductor devices. Thus, processes for the formation of the capping insulating layers 330 and the spacers 350 can be omitted.

An interlayer dielectric layer 230 is formed of silicon oxide to cover the bit line stacks 300. Here, the interlayer dielectric layer 230 is formed to a thickness of about 4000 to about 5000 Å.

A BC process is performed on the interlayer dielectric layer 230. In other words, the interlayer dielectric layer 230 is etched by a photolithography process to form a second contact hole 235 which perforates through the interlayer dielectric layer 230. The second contact hole 235 is prepared for a BC which is electrically connected to the active region 120 of the semiconductor substrate 100. Thus, the second contact hole 235 is preferably formed so as to expose the upper surface of the conductive pad 410 which is electrically connected to the active region 120 of the semiconductor substrate 100. Then, the second contact hole 235 is formed to expose the sidewalls of the spacers 350 and the capping layers 330 of the bit line stack 300.

A third conductive layer is formed to fill the second contact hole 235. The third conductive layer is planarized by etch back or CMP to form a conductive plug 450 until the interlayer dielectric layer 230 is exposed. As a result, the second contact hole 235 is filled with the conductive plug 450. According to a preferred embodiment of the present invention, the conductive plug 450 is formed of doped polysilicon having conductivity.

Figure 2:
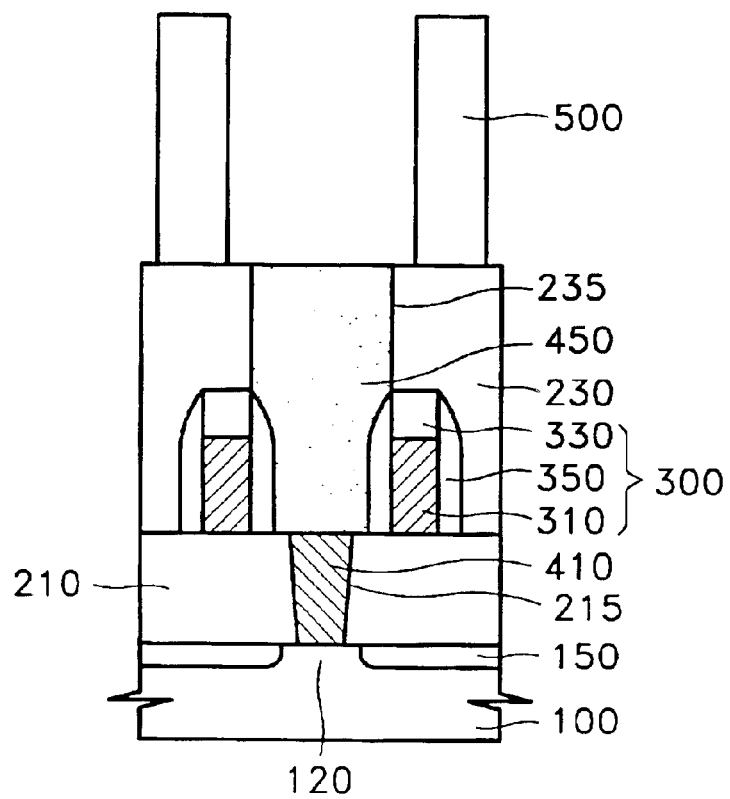

FIG. 2 shows the steps of forming molds 500 on the interlayer dielectric layer 230. The mold 500 will be used for support for forming storage electrode of a capacitor, which will be explained below in detail. Referring to FIG. 2, a silicon oxide layer is deposited on the interlayer dielectric layer 230 to a predetermined thickness. The silicon oxide layer is etched by a photolithography process to form molds 500, thereby exposing the conductive plug 450. The mold 500 has 3-dimensional shapes, e.g., cylindrical shapes or nest shapes, it is preferably patterned by an reverse storage node patterning method, i.e., patterned in an inverse layout of a storage electrode. According to a preferred embodiment of the present invention, the mold 500 is formed of silicon oxide and the height of a height is about 10000 Å. This is to increase the surface area of a storage electrode since the height of the sidewalls of the storage electrode depends on the height of the molds 500. The width of the mold 500 is preferably narrower than the interlayer dielectric layer 230.

Figure 3:
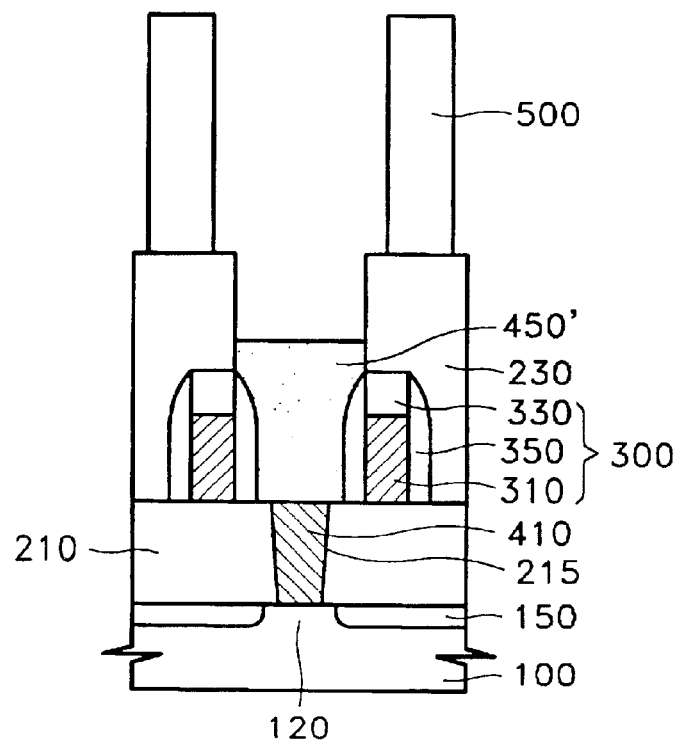

FIG. 3 shows the steps of recessing the surface of the conductive plug 450. Referring to FIG. 3, the conductive plug 450 is recessed to below the interlayer electric layer 230. Here, as the molds 500 are preferably formed of silicon oxide, and the conductive plug 450 is preferably formed of polysilicon, the conductive plug 450 formed of polysilicon is selectively etched, so that the height of the conductive layer 450 is lower than the interlayer dielectric layer 230. If the step of recessing the surface of the conductive plug 450 is performed by chemical dry etching, It is preferable that the chemical dry etching is performed using a fluorine-based gas as an etching gas. The fluorine-based gas includes $CF_4$ or $CHF_3$. Preferably, the etching gas further includes $O_2$ and $N_2$. In a case where the etching gas includes $CF_4$, it includes $O_2$, preferably about 4 to about 14 times of the mole of $CF_4$. In this case, the etching gas further includes $N_2$.

According to an embodiment of the present invention, the chemical dry etching using such etching gas is performed by a remote plasma method. The chemical dry etching is preferably performed by a method by which bias is not applied to the backside of the semiconductor substrate 100, e.g., a method corresponding to an anisotropic etching. Also, the chemical dry etching is preferably performed at a low temperature of about 0 to about 100° C. As the chemical dry etching shows an excellent etching selectivity ratio of silicon oxide to polysilicon of about 1:100 to about 1:200, the conductive plug 450 is selectively recessed to the molds 500 and the interlayer dielectric layers 230.

The edges and sidewalls of the interlayer dielectric layer 230 and the mold 500 are exposed when the conductive plug 450 is selectively etched. However, as described above, since a high etching selectivity ratio can be obtained using chemical etching, the edges and sidewalls of the interlayer dielectric layer 230 and the mold 500 are prevented from being seriously etched. In a case where the sidewalls of the molds 500 are damaged, defects may be generated in a subsequent process of depositing a storage electrode. However, by taking advantage of the high etching selectivity ratio of silicon oxide to polysilicon, the sidewalls of the molds 500 are prevented from being damaged.

As described above, the conductive plug 450 is recessed by the chemical dry etching. Thus, the height of the conductive plug 450 is substantially lower than the height of the interlayer dielectric layer 230. As a result, the sidewalls of the interlayer dielectric layer 230 are exposed. During recessing, the height of the conductive plug 450 is adjusted based on the time required for performing the chemical dry etching.

Meanwhile, the spacers 350 and the capping layers 330 are exposed during the recessing of the conductive plug 450.

However, the spacers 350 and the capping layers 330, which are preferably formed of silicon nitride, can have an etching selectivity ratio to polysilicon of about 1:20 in the above chemical dry etching. Thus, the chemical dry etching selectively recesses the conductive plug 450. Accordingly, a recessed conductive plug 450' is formed using chemical dry etching.

Figure 4:
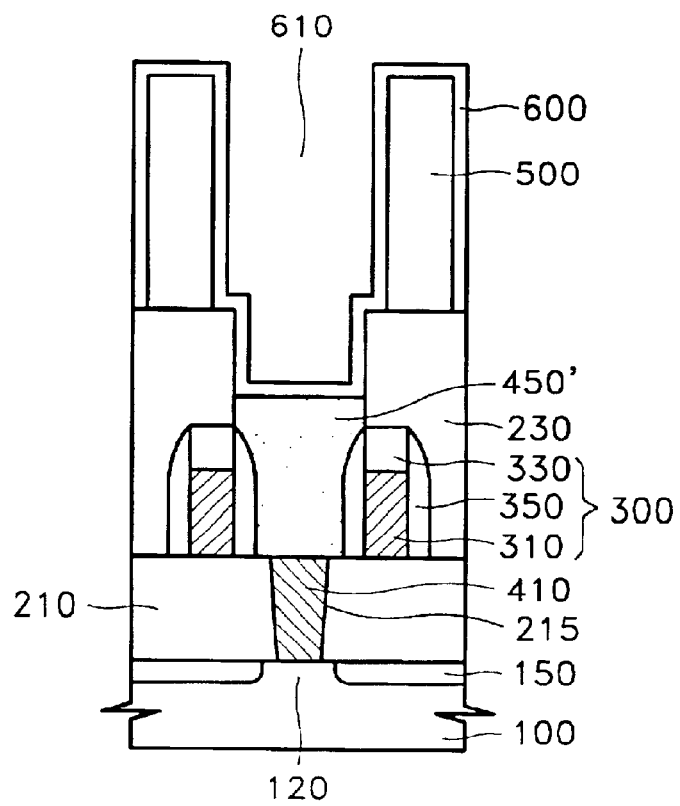

FIG. 4 shows the steps of forming an electrode layer 600 on the sidewalls of the molds 500 and on the recessed conductive plug 450'. Referring to FIG. 4, an electrode layer 600 is deposited on the recessed conductive plug 450' using a known electrode material to cover the sidewalls of the molds 500 and the sidewalls of the interlayer dielectric layer 230 which is exposed during recessing. Preferably, the electrode layer 600 is formed of conductive polysilicon.

Figure 5:
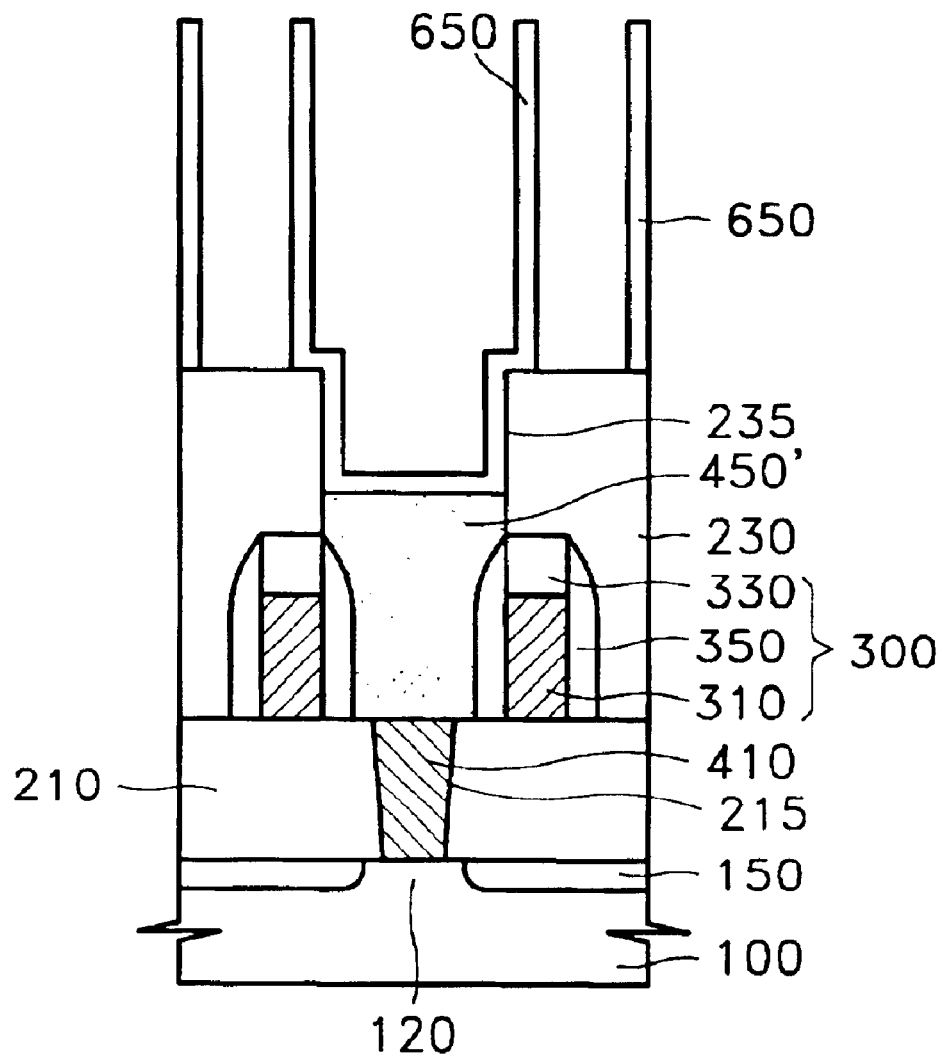

FIG. 5 shows the steps of removing portions of the electrode layer 600 covering the upper surface of the molds 500 to divide the electrode layer 600 into each of storage electrodes 650. Referring to FIG. 5, portions of the electrode 600 covering the upper surface of the molds 500 are removed by a planarization process such as CMP to form storage electrodes 650. A sacrificial layer (not shown) may be formed on the electrode layer 600 to fill the gap 610 of electrode layer 600 before the planarization process. In the case forming the sacrificial layer (not shown), the planarization process is performed on the surface of the sacrificial layer (now shown) until upper portions of the electrode 600 on the molds are removed. The sacrificial layer (not shown) is preferably formed of silicon oxide.

The sacrificial layer (now shown) and the molds 500 are removed to complete the formation of the storage electrodes 650, each having a cylindrical shape. Here, the molds 500 and the sacrificial layer are removed by wet etching using a wet etchant for silicon oxide. According to a preferred embodiment of the invention, an upper part of the storage electrode 650 above the interlayer dielectric layer 230 is wider than a lower part of the storage electrode 650.

The surface area of the storage electrodes 650 increases in proportion to the recess depth of the conductive plug 450'. In other words, the storage electrodes 650 extend to the sidewalls of the interlayer dielectric layer 230 exposed by the conductive plug 450'. Thus, the effective surface area of the storage electrodes 650 can be substantially widened.

A dielectric layer (not shown) and an upper electrode (not shown) are formed on the storage electrodes 650 to complete the formation of a capacitor. Here, the effective surface area of the storage electrodes 650 can increase further. Thus, the capacitance of a capacitor can be increased without an increase in the area of the capacitor.

Although the invention has been described with reference to a particular embodiment, it will be apparent to one of ordinary skill in the art that modifications of the described embodiment may be made without departing from the spirit and scope of the invention.

What is claimed is:

1. A method of manufacturing a semiconductor device having a capacitor, comprising the steps of:

forming a contact hole perforating through an interlayer dielectric layer on a semiconductor substrate;

forming a conductive plug to fill the contact hole and expose the surface of the interlayer dielectric layer;

forming molds on the interlayer dielectric layer to expose the surface of the conductive plug;

recessing the upper surface of the conductive plug to expose a portion of the sidewalls of the interlayer dielectric layer after forming molds on the interlayer dielectric layer;

forming an electrode layer to cover the recessed conductive plug, and the sidewalls of the interlayer dielectric layer and the molds; and removing upper surfaces of the electrode layer to make a storage electrode until molds are exposed.

2. The method of claim 1, further comprising the steps of:

forming a conductive pad electrically connected to the semiconductor substrate and a lower insulating layer surrounding the conductive pad; and forming bit line stacks on the lower insulating layer, wherein the interlayer dielectric layer covers the bit line stacks, and the contact hole between the bit line stacks exposes the conductive pad.

3. The method of claim 2, wherein each of the bit line stacks includes a bit line, a capping layer covering upper surfaces of the bit line, and spacers at least covering sidewalls of the bit line, and wherein the contact hole exposes the sidewalls of the capping layer and the spacers.

4. The method of claim 1, wherein the interlayer dielectric layer is formed of silicon oxide.

5. The method of claim 1, wherein the molds are formed of silicon oxide.

6. The method of claim 1, wherein the conductive plug is formed of polysilicon.

7. The method of claim 1, wherein the step of recessing the upper surface of the conductive plug is performed by chemical dry etching.

8. The method of claim 7, wherein the chemical dry etching is performed by using an etching gas containing a fluorine-based gas.

9. The method of claim 8, wherein the fluorine-based gas is $CF_4$ or $CHF_3$.

10. The method of claim 8, wherein the etching gas further contains $O_2$ or $N_2$.

11. The method of claim 8, wherein the chemical dry etching is performed by a remote plasma method.

12. The method of claim 11, wherein the chemical dry etching is performed at a temperature of about 0 to about 100° C.

13. The method of claim 7, wherein the chemical dry etching is performed by anisotropic etching.

14. The method of claim 1, further comprising removing the molds after removing the upper surfaces of the electrode layer.

15. The method of claim 3, wherein the step of recessing the upper surface of the conductive layer is performed until the spacers and the capping layer are exposed.

16. The method of claim 15, wherein the capping layer is formed of silicon nitride.

17. The method of claim 15, wherein the spacers are formed of silicon nitride.

* * * * *